United States Patent [19]

Kowata et al.

[11] Patent Number: 4,612,566

[45] Date of Patent: Sep. 16, 1986

[54] MICROWAVE TRANSISTOR MOUNTING STRUCTURE

[75] Inventors: Masakatsu Kowata; Torao Hiyama, both of Haramachi, Japan

[73] Assignee: Alps Electric Co., Ltd., Japan

[21] Appl. No.: 674,591

[22] Filed: Nov. 26, 1984

[30] Foreign Application Priority Data

Nov. 30, 1983 [JP] Japan ............... 58-183774[U]

[51] Int. Cl.[4] ............................................ H01L 23/48
[52] U.S. Cl. ....................................... 357/80; 361/388; 361/403
[58] Field of Search ................ 333/247; 357/80, 81; 361/383, 386, 387, 388, 400, 403

[56] References Cited

U.S. PATENT DOCUMENTS

| | | | |
|---|---|---|---|
| 2,985,806 | 5/1961 | McMahon, Jr. et al. | 357/80 |
| 3,021,461 | 2/1962 | Oakes et al. | 357/80 |
| 3,641,398 | 2/1972 | Fitzgerald, Jr. | 357/80 |
| 3,825,803 | 7/1974 | Budde | 357/81 |
| 4,172,261 | 10/1979 | Tsuzuki et al. | 333/247 |
| 4,455,537 | 6/1984 | La Prade et al. | 333/246 |
| 4,538,124 | 8/1985 | Morrison | 333/247 |

FOREIGN PATENT DOCUMENTS

| | | |
|---|---|---|
| 0054472 | 5/1978 | Japan . |
| 0159571 | 11/1980 | Japan . |
| 0115852 | 7/1982 | Japan . |
| 0143896 | 9/1982 | Japan . |

Primary Examiner—James W. Davie
Assistant Examiner—Vangelis Economou
Attorney, Agent, or Firm—Guy W. Shoup

[57] ABSTRACT

Disclosed is a microwave transistor mounting structure which comprises a chassis formed with raised portions, a substrate formed with a hole, and a microwave transistor, the raised portions of the chassis being engaged with the hole of the substrate, the grounding terminals of the microwave transistor being mounted on the raised portions, and the other terminals of the microwave transistor being mounted on the substrate.

2 Claims, 4 Drawing Figures

MICROWAVE TRANSISTOR MOUNTING STRUCTURE

BACKGROUND OF THE INVENTION

1. Field of the Invention

The present invention relates to a microwave transistor mounting structure and particularly to a microwave transistor mounting structure in which a microwave transistor can be easily mounted and a stable grounding effect can be obtained.

2. Description of Prior Art

Recently, communication networks have been remarkably developed, a satellite communication system being one of such networks. For such satellite communication, frequencies in $GH_z$ band are used and $G_aA_s$ (gallium arsenic) FETs or the like have begun to be used as signal amplifying elements in such a $GH_z$ frequency band communication. In the frequencies within the microwave frequency band ($GH_z$ frequency band) or in the higher frequency band, the inductance provided to a terminal per se, which extends to a grounded point, of a microwave transistor such as a $G_aA_s$ FET or the like can not disregarded, and problems such as reduction in gain of the microwave transistor, deterioration in negative feedback, instability (positive feedback), etc., are caused. Accordingly, as to a microwave transistor, it is necessary to ground effectively at a minimum distance.

In the conventional mounting structure of the kind as described above, it has been necessary to perform bending in the manufacture to a ground terminal of a microwave transistor such as a $G_aA_s$ FET or the like. For example, in FIGS. 1 and 2 showing a conventional microwave transistor mounting structure, a microwave transistor 1 such as a $G_aA_s$ FET (gallium arsenic field effect transistor) or the like is provided with four terminals 1a, 1b, 1c, and 1d. The grounding terminals 1b and 1d have been subject to bending at their intermediate portion. Reference numeral 2 designates an alumina substrate or a circuit substrate of a copper clad laminated plate or the like, and 3 designates a metal chassis. The microwave transistor 1 is disposed on the substrate 2, with the terminal 1a and 1c connected to the substrate 2 by soldering or the like and with the terminals 1b and 1d grounded onto the chassis 3. Reference numeral 4 designates solder.

In such a conventional structure, however, the inductance inherently provided to the gronding terminals 1b and 1d per se can not be neglected and it is difficult to obtain sufficient performance of the microwave transistor. Further, it is necessary to perform bending to the grounding terminals 1b and 1d, and it is required to divide the substrate 2, which is primarily one piece, into two portions. Furthermore, it is required to mount the microwave transistor 1 at the later step. Thus, not only there was disadvantageous in assembling workability but, as described above, the grounding effect is not always good because the grounding terminals were elongated due to bending.

There is another example of the conventional structure, in which a microwave transistor has its ground terminals connected through holes in a substrate to rear electrodes, whereby they can be grounded onto a metal chassis. Although this structure is advantageous in view of assembling workability in comparison with the above-mentioned prior art example, the inductance is large similarly to the above-mentioned example and therefore it is difficult to use this example structure in the microwave frequency band.

SUMMARY OF THE INVENTION

An object of the present invention is therefore to solve the above-mentioned problems in the prior art.

Another object of the present invention is to provide a microwave transistor mounting structure in which a microwave transistor is effectively grounded.

In order to attain the above-mentioned objects, the microwave transistor mounting structure according to the present invention is featured in that the structure comprises a chassis provided with raised portions, a substrate formed with a hole, and a microwave transistor, whereby the raised portions of the chassis are engaged with the hole of the substrate, and the grounding terminals of the microwave transistor are mounted on the raised portions, while the other terminals of the microwave transistor are mounted on the substrate.

Other and further objects, features and advantages of the present invention will appear more fully from the following description in conjunction with the accompanying drawings.

DESCRIPTION OF PREFERRED EMBODIMENT

Figure 1:
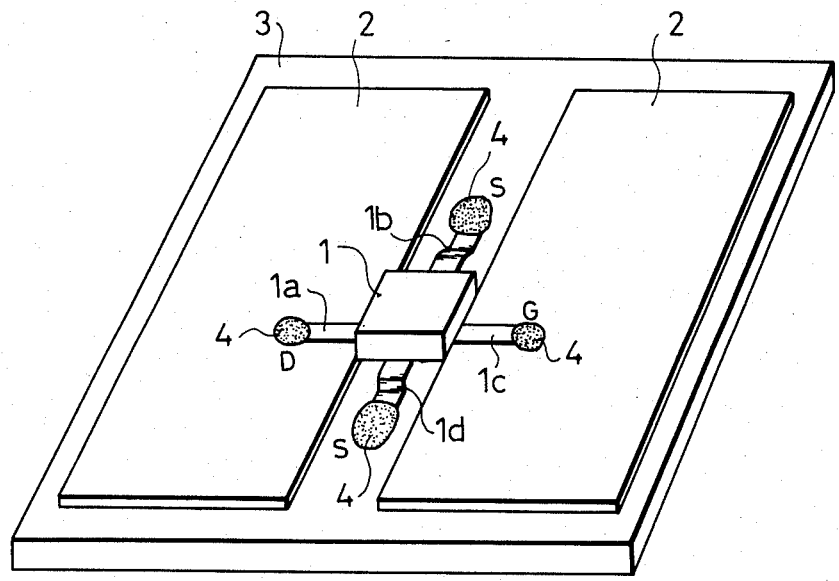
FIG. 1 is a perspective view showing the conventional microwave mounting structure.
Figure 2:
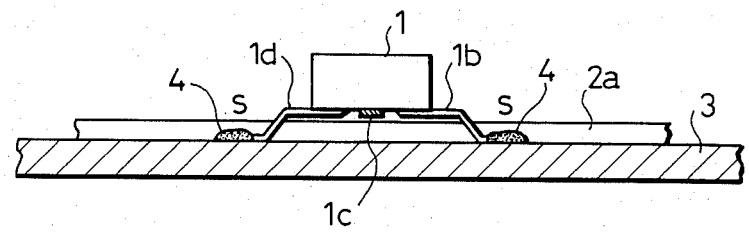
FIG. 2 is a cross-section of a main part of the structure of FIG. 1.
Figure 3:
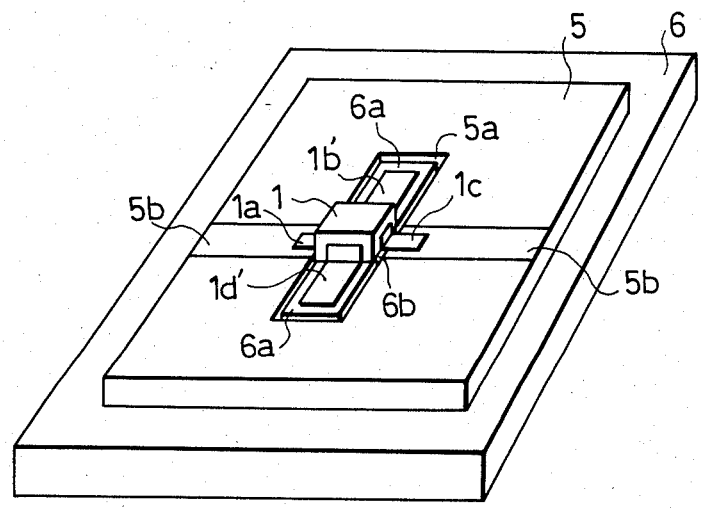
FIG. 3 is a perspective view showing an embodiment of the microwave mounting structure according to the present invention.
Figure 4:
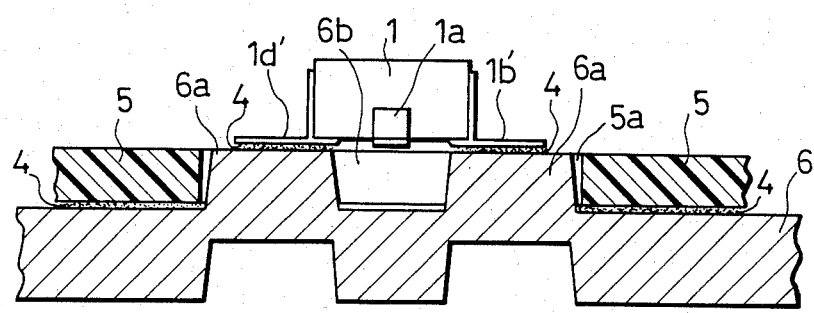
FIG. 4 is a cross-section of a main part of the structure of FIG. 3.

Referring to FIGS. 3 and 4, a preferred embodiment of the present invention will be described hereunder.

FIG. 3 is a perspective view showing an embodiment of the microwave mounting structure according to the present invention, and FIG. 4 is a cross-section of a main part of the same structure. In the drawings, a circuit substrate 5 is made of alumina or the like is formed with a hole 5a at a position at which a microwave transistor 1 is mounted. Reference numeral 6 designates a metal chassis provided with raised portions 6a and 6a which are formed by press wording at a portion corresponding to the hole 5a of the substrate 5 by press working. The raised portions 6a and 6a are formed to have substantially the same height as that of the substrate 5 when the substrate 5 is placed on the chassis 6. The microwave transistor 1 has a drain terminal 1a, a gate terminal 1c, and source terminals 1b' and 1d'.

In the thus arranged microwave transistor mounting structure, the substrate 5 is first fixedly attached to the chassis 6 at a position such that the hole 5a formed in the substrate 5 corresponds to the raised portions 6a and 6a. Then, the microwave transistor 1 is disposed such that the terminals 1a and 1c are respectively mounted on micro strip lines 5a and 5b formed on the substrate 5 and the terminals 1b' and 1d' are respectively mounted on the raised portions 6a and 6a. The terminals 1a and 1c are respectively connected to the micro strip lines 5a and 5b through solder 4 or the like and the terminals 1b' and 1d' are respectively connected to the raised portions 6a and 6a formed on the chassis 6, so that the terminals 1b' and 1d' which are the source leads are grounded through the raised portions 6a and 6a of the chassis 6. At this time, under the lower surface of the transistor 1, there is an air gap 6b sandwiched between the raised portions 6a and 6a.

As described above, in the the microwave transistor mounting structure according to the present invention, the terminals 1b' and 1d' of the microwave transistor 1 are connected through the hole 5a of the substrate 5 to the raised portions 6a and 6a formed substantially in the same plane as the substrate 5 of the chassis 6, whereby the teminals 1b' and 1d' which are the source leads of the microwave transistor 1 are made very short to reduce the inductance thereof to thereby improve the grounding effect.

Further, as to the assembling workability, the hole 5a of the substrate 5 is engaged with the raised portions 6a and 6a formed in the chassis 6 to position the substrate 5, so that the substrate 5 can be easily attached. Furthermore, the substrate 5 is not divided into pieces unlike in the conventional structure in which the substrate was divided into two portions, so that there is an advantage that the microwave transistor 1 can be previously mounted on the substrate together with other circuit elements. There is a further advantage, therefore, that the transistor can be attached by a reflow soldering step similarly to the other circuit elements, resulting in reduction in number of working steps.

We claim:

1. A microwave transistor mounting structure for mounting a microwave transistor and grounding a pair of terminals thereof having short lengths extending linearly in opposite directions on either side of a width of the transistor, and for connecting other leads thereof to other elements, comprising:
    a chassis plate formed to have a pair of upwardly projected grounding portions having top surfaces projected a selected height above said chassis plate and being spaced apart by a distance substantially equal to said width of said transistor;
    an insulator substrate sheet mounted on said chassis plate having a thickness substantially equal to said height of said projected grounding portions and provided with a hole through which said pair of projected grounding portions project, so that said pair of grounding terminals of said microwave transistors can each be mounted on and electrically connected to the top surface of a respective one of said projected grounding portions;
    wherein said grounding terminals can be grounded by only said short lengths extending linearly from said transistor, and a gap of said projected portion height is maintained between said transistor and said chassis plate below; and
    wherein said other leads of said microwave transistor can be mounted to other areas of the insulator substrate sheet and connected to other elements mounted thereon in proximity to said leads.

2. A microwave transistor mounting structure according to claim 1, wherein said hole is dimensioned to fit closely over said pair of projected grounding portions, whereby said insulator substrate sheet can be readily positioned thereover for assembly.

* * * * *